United States Patent
Olien et al.

(10) Patent No.: US 9,466,783 B2
(45) Date of Patent: Oct. 11, 2016

(54) SUSPENSION ELEMENT HAVING INTEGRATED PIEZO MATERIAL FOR PROVIDING HAPTIC EFFECTS TO A TOUCH SCREEN

(75) Inventors: Neil Olien, Monteal (CA); Daniel Parker, San Carlos, CA (US); Allan Visitacion, Fremont, CA (US); Trevor Jones, Campbell, CA (US); Frank Ye, Danville, CA (US)

(73) Assignee: Immersion Corporation, San Jose, CA (US)

( * ) Notice: Subject to any disclaimer, the term of this patent is extended or adjusted under 35 U.S.C. 154(b) by 338 days.

(21) Appl. No.: 13/558,475

(22) Filed: Jul. 26, 2012

(65) Prior Publication Data

US 2014/0028573 A1 Jan. 30, 2014

(51) Int. Cl.
*H01L 41/311* (2013.01)
*G06F 3/041* (2006.01)
*H01L 41/35* (2013.01)
(Continued)

(52) U.S. Cl.
CPC .............. *H01L 41/35* (2013.01); *G06F 3/016* (2013.01); *G06F 3/041* (2013.01); *G06F 3/048* (2013.01); *G06F 3/0414* (2013.01); *H01L 41/25* (2013.01); *H01L 41/311* (2013.01); *Y10T 29/42* (2015.01); *Y10T 29/49005* (2015.01); *Y10T 29/49126* (2015.01)

(58) Field of Classification Search
CPC ...... G06F 3/016; G06F 3/041; G06F 3/0414; G06F 3/048; H01L 41/35; H01L 41/311; H01L 41/25; Y10T 29/42; Y10T 29/49005; Y10T 29/49126
See application file for complete search history.

(56) References Cited

U.S. PATENT DOCUMENTS

| 3,128,999 A | 4/1964 | Schmitt |
| 4,556,130 A | 12/1985 | Puszakowski |

(Continued)

FOREIGN PATENT DOCUMENTS

| CN | 102221889 | 10/2011 |
| CN | 202094851 | 12/2011 |

(Continued)

OTHER PUBLICATIONS

Machine Translation (in English) of Japanese Patent Publication, JP 2010-244283, May 2016.*

(Continued)

*Primary Examiner* — A. Dexter Tugbang
(74) *Attorney, Agent, or Firm* — Medler Ferro Woodhouse & Mills

(57) ABSTRACT

Methods of manufacturing a haptic device having a compliant suspension element. Segments of piezo material are coupled to at least one surface of at least one compliant suspension element, and the at least one suspension element is coupled to a touch screen component. The at least one suspension element is also coupled to a housing component. The segments of piezo material are configured to produce a force that moves the touch screen component relative to the housing component and thereby provide a haptic effect to a user of the touch screen component. In reaction to the force produced by the segments of piezo material, the at least one suspension element is configured to allow movement of the touch screen component relative to the housing component in a first direction and to limit movement between the touch screen component and the housing component in at least a second direction.

20 Claims, 10 Drawing Sheets

(51) Int. Cl.
*G06F 3/01* (2006.01)
*H01L 41/25* (2013.01)
*G06F 3/048* (2013.01)

(56) References Cited

U.S. PATENT DOCUMENTS

| | | | |
|---|---|---|---|
| 5,335,893 A | 8/1994 | Opp | |
| 5,419,626 A | 5/1995 | Crockett | |
| 5,568,357 A | 10/1996 | Kochis et al. | |
| 5,594,574 A | 1/1997 | Lara et al. | |
| 5,751,551 A | 5/1998 | Hileman et al. | |
| 5,765,819 A | 6/1998 | Hummel | |
| 5,965,249 A | 10/1999 | Sutton et al. | |
| 6,744,903 B1 | 6/2004 | Jeon | |
| 6,822,635 B2 | 11/2004 | Shahoian et al. | |
| 6,879,318 B1* | 4/2005 | Chan et al. | G06F 3/0414 |
| 6,882,528 B2 | 4/2005 | Chuang | |
| 6,975,305 B2 | 12/2005 | Yamashita | |
| 7,267,313 B2 | 9/2007 | Krzoska et al. | |
| 7,616,436 B2 | 11/2009 | DeMoss et al. | |
| 7,633,745 B2 | 12/2009 | Sakakibara et al. | |
| 7,835,147 B2 | 11/2010 | Merz et al. | |
| 7,839,639 B2 | 11/2010 | Najbert | |
| 8,061,673 B2 | 11/2011 | Yao | |
| 8,068,337 B2 | 11/2011 | Yao et al. | |
| 8,362,882 B2 | 1/2013 | Heubel et al. | |
| 2002/0180712 A1* | 12/2002 | Sato | G06F 3/041 |
| 2003/0206202 A1 | 11/2003 | Moriya | |
| 2004/0160422 A1* | 8/2004 | Choi | G06F 3/041 |
| 2006/0022952 A1 | 2/2006 | Ryynanen | |
| 2006/0023416 A1 | 2/2006 | Chen | |
| 2006/0109254 A1* | 5/2006 | Akieda | G06F 3/016 |
| 2006/0181517 A1 | 8/2006 | Zadesky et al. | |
| 2008/0055277 A1 | 3/2008 | Takenaka et al. | |
| 2008/0060856 A1 | 3/2008 | Shahoian et al. | |
| 2008/0111788 A1 | 5/2008 | Rosenberg et al. | |
| 2009/0015549 A1 | 1/2009 | Gelfond et al. | |
| 2010/0045612 A1 | 2/2010 | Molne | |
| 2010/0117809 A1* | 5/2010 | Dai | G06F 3/041 |
| 2010/0127140 A1 | 5/2010 | Smith | |
| 2010/0172080 A1 | 7/2010 | Bestle | |
| 2010/0245254 A1 | 9/2010 | Olien et al. | |
| 2011/0032091 A1 | 2/2011 | Park et al. | |
| 2011/0043454 A1 | 2/2011 | Modarres et al. | |
| 2011/0053653 A1 | 3/2011 | Tho et al. | |
| 2011/0080350 A1 | 4/2011 | Almalki et al. | |
| 2011/0164365 A1 | 7/2011 | McClure et al. | |
| 2011/0227849 A1 | 9/2011 | Olien et al. | |
| 2011/0291996 A1 | 12/2011 | Gao et al. | |
| 2012/0206248 A1 | 8/2012 | Biggs | |
| 2013/0044049 A1 | 2/2013 | Biggs et al. | |
| 2013/0100607 A1 | 4/2013 | Ternus et al. | |

FOREIGN PATENT DOCUMENTS

| | | |
|---|---|---|
| DE | 200 19 074 U1 | 2/2001 |
| EP | 1 691 263 | 8/2006 |
| JP | 2006048453 A * | 2/2006 |
| JP | 2010244283 A * | 10/2010 |
| JP | 2012-108402 | 6/2012 |
| WO | WO-2004/081776 | 9/2004 |
| WO | 2010/116962 | 10/2010 |
| WO | 2012/002664 | 1/2012 |
| WO | 2012/067370 | 5/2012 |

OTHER PUBLICATIONS

International Search Report, PCT/US13/47893, Jan. 14, 2014.
"Extended European Search Report", European Patent Application No. 13 882 307.8, Sep. 24, 2015.

* cited by examiner

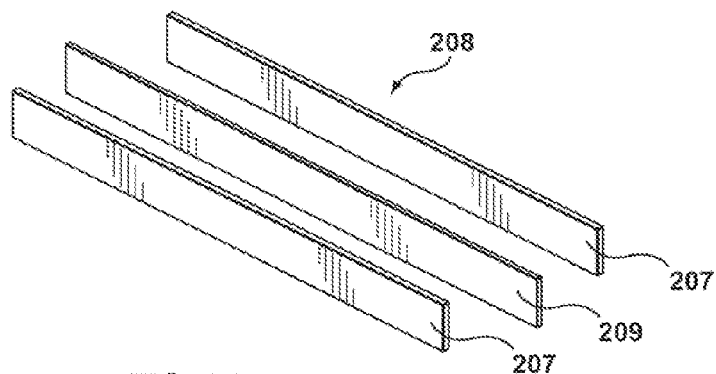
FIG. 2A
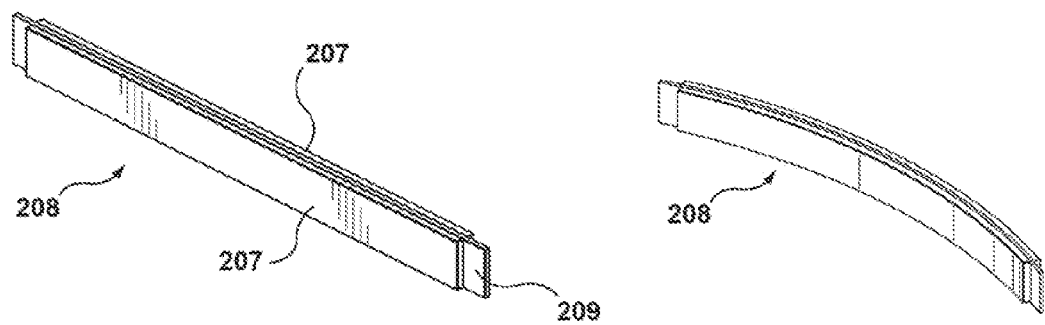
FIG. 2
FIG. 2B

SUSPENSION ELEMENT HAVING INTEGRATED PIEZO MATERIAL FOR PROVIDING HAPTIC EFFECTS TO A TOUCH SCREEN

FIELD OF THE INVENTION

The present invention relates generally to touch screens and other touch surfaces, more particularly to touch screens and touch surfaces which provide haptic feedback to the user.

BACKGROUND OF THE INVENTION

New generation consumer devices increasingly rely on touch screen inputs such as virtual buttons and sliders displayed on a screen as an alternative to physical inputs. Users may interface with such devices almost exclusively by touching and/or otherwise manipulating the virtual buttons, sliders, scrollers, and the like on the screen with one or more finger(s). Graphic displays on the screen provide visual feedback responsive to such manipulation. In some more recent touch screen devices, force feedback or tactile feedback, commonly collectively known as haptic feedback, can also be provided to a user as the user's fingers interact with virtual objects on the touch screen. This is accomplished generally by moving or vibrating the screen with a haptic actuator coupled to the screen.

To allow the haptic touch screen to move in response to the haptic actuator and thereby to isolate a haptic effect to the screen, haptic touch screens have been compliantly suspended within electronic devices in which they reside. It is important, however, that, even though the screen must be able to move when the haptic actuator is activated, the suspended screen must nevertheless feel to a user as if it were substantially rigidly mounted when touched. Others have addressed the problem by not using a suspension, but not using a suspension limits the mass of the system that can have haptic effects.

Suspensions utilizing compliant grommet for mounting touch screens and touch surfaces within a housing are known, as illustrated in U.S. patent application Ser. No. 13/049,265 to Olien et al., filed Mar. 16, 2011, herein incorporated by reference in its entirety. More particularly, FIG. 1 reproduced from Olien et al. illustrates an exploded view of various components of an electronic touch screen system 100 for providing haptic feedback to a touch screen 102 that utilizes a plurality of grommet suspension elements 104 in a compliant suspension system. In addition to touch screen 102, touch screen system 100 includes a carrier 106, a motor or haptic actuator 108, a dust seal 110, an LCD component 112, and a main housing component 114. Grommet suspension elements 104 are configured to allow preferential movement of touch screen 102 in a certain direction, such as an −x direction, while limiting movement in other directions, such as the y- and z-directions.

Haptic actuator 108 may be any of a number of known actuator types including, without limitation, a piezo actuator, voice coil actuator, an eccentric mass actuator, an E-core type actuator, a solenoid, a moving magnet actuator, or other type of actuator as desired. Piezoelectric actuators have the property of developing an electric charge when mechanical stress is exerted on them. A piezoelectric actuator 208 is shown in FIG. 2 as available from a commercial manufacturer. Piezoelectric actuator 208 includes a flat intermediate substrate 209 and two segments 207 of piezo material bonded or otherwise coupled to both sides of substrate 209, as best shown in the exploded view of FIG. 2A. When mechanical stress is exerted onto segments 207 of piezo material, piezoelectric actuator 208 develops an electric charge and bends as shown in FIG. 2B. The operation of piezoelectric actuators to output force based on an input electrical signal is well known to those skilled the art. In order to attach piezoelectric actuator 208 to a haptic system, the entire actuator unit or assembly including substrate 209 and segments 207 of piezo material is clamped onto the system. A clamp (not shown) for coupling the actuator to the system may be designed or integrated into a system component or may be a separate clamp component.

In addition to compliant grommet components, other suspensions have been proposed for touch screen applications as illustrated in U.S. Pat. Appl. Pub. No. 2008/0111788 A1 to Rosenberg et al., herein incorporated by reference in its entirety, and U.S. Pat. Appl. Pub. No. 2010/0245254 A1 to Olien et al, herein incorporated by reference in its entirety. FIG. 3, which is reproduced from Rosenberg et al., illustrates a touch screen system 300 having one or more spring elements 304 coupled between a touchpad or touch screen 302 and a main housing component 314. Spring elements 304 are shown as helical or coiled elements, but may be a compliant material such as rubber, foam, or flexures. Spring elements 304 couple touch screen 302 to the rigid housing 314 of system 300 and allow touch screen 302 to be moved along the z-axis. In the embodiment of FIG. 3, one or more piezoelectric actuators 308 are coupled to the underside of a touch screen 302 and serve to output a small pulse, vibration, or texture sensation onto touch screen 302 and to the user if the user is contacting the touch screen.

A need exists in the art for improved and/or alternative compliant suspension systems for haptic touch screens.

SUMMARY OF THE INVENTION

Embodiments hereof are directed to a method of manufacturing a haptic device having a compliant suspension system. Segments of piezo material are coupled to at least one surface of at least one compliant suspension element, and the at least one suspension element is coupled to a touch screen component. The at least one suspension element is also coupled to a housing component. The segments of piezo material are configured to produce a force that moves the touch screen component relative to the housing component and thereby provide a haptic effect to a user of the touch screen component. In reaction to the force produced by the segments of piezo material, the at least one suspension element is configured to allow movement of the touch screen component relative to the housing component in at least a first direction.

In another embodiment hereof, a method of manufacturing a haptic device having a compliant suspension system includes coupling segments of piezo material to at least one surface of a touch screen component and coupling the touch screen component to a housing component such that the touch screen component is movable relative thereto. The segments of piezo material are configured to produce a force that moves the touch screen component relative to the housing component and thereby provide a haptic effect to a user of the touch screen component.

Embodiments hereof also relate to a haptic device having a compliant suspension system including a housing component, a touch screen component, and at least one compliant suspension element that couples the touch screen and housing components together such that the touch screen component is movable relative to the housing component. A segment of piezo material is coupled to at least one surface of the at least one suspension element for producing a force that moves the touch screen component relative to the housing component and thereby provide a haptic effect to a user of the touch screen component, wherein in reaction to the force produced by the segments of piezo material the at least one suspension element is configured to allow movement of the touch screen component relative to the housing component in a first direction.

BRIEF DESCRIPTION OF DRAWINGS

The foregoing and other features and advantages of the invention will be apparent from the following description of embodiments thereof as illustrated in the accompanying drawings. The accompanying drawings, which are incorporated herein and form a part of the specification, further serve to explain the principles of the invention and to enable a person skilled in the pertinent art to make and use the invention. The drawings are not to scale.

FIG. 2 is a perspective view of a commercially available piezoelectric actuator.

FIG. 2A is an exploded view of the piezoelectric actuator of FIG. 2.

FIG. 2B is a perspective view of the piezoelectric actuator of FIG. 2 after producing an electric charge and bending in response thereto.

DETAILED DESCRIPTION OF THE INVENTION

Specific embodiments of the present invention are now described with reference to the figures, wherein like reference numbers indicate identical or functionally similar elements. The following detailed description is merely exemplary in nature and is not intended to limit the invention or the application and uses of the invention. Although descriptions of embodiments hereof are in the context of a suspension system for an electronic touch screen, the invention may also be used in any other applications where it is deemed useful. Furthermore, there is no intention to be bound by any expressed or implied theory presented in the preceding technical field, background, brief summary or the following detailed description.

Embodiments hereof are directed to a suspension element for mounting touch screens and touch surfaces within a housing, wherein piezo material is integrally coupled to the suspension element for providing haptic effects to the touch screen or surface. The suspension system will be described below within the context of a touch screen wherein a graphical display is disposed behind a touch surface or touch element. It will be understood, however, that the invention is not limited to suspensions for such touch screens but is equally applicable to any haptically excited touch surface or touch element. For example, the suspension system might be applied to suspend the touch pad of a computer wherein the display screen is not co-located with the touch pad. It may be applied to suspend a touch element with at least one touch sensitive region or an array of touch sensitive regions that may be created by capacitive sensors, near field effect sensors, piezo sensors, or other sensor technology. The graphical element may be a display located behind or in a separate location from the touch element and updated by a host computer, or it may simply be a plastic surface with features (e.g. graphics) indicating touch sensitive regions of an associated touch element. Thus, the terms touch screen and touch screen component when used in the following detailed description and in the claims should be construed to encompass traditional touch screens as well as any touch surface or touch element and associated graphical element to which haptic effects may be applied.

Figure 1:
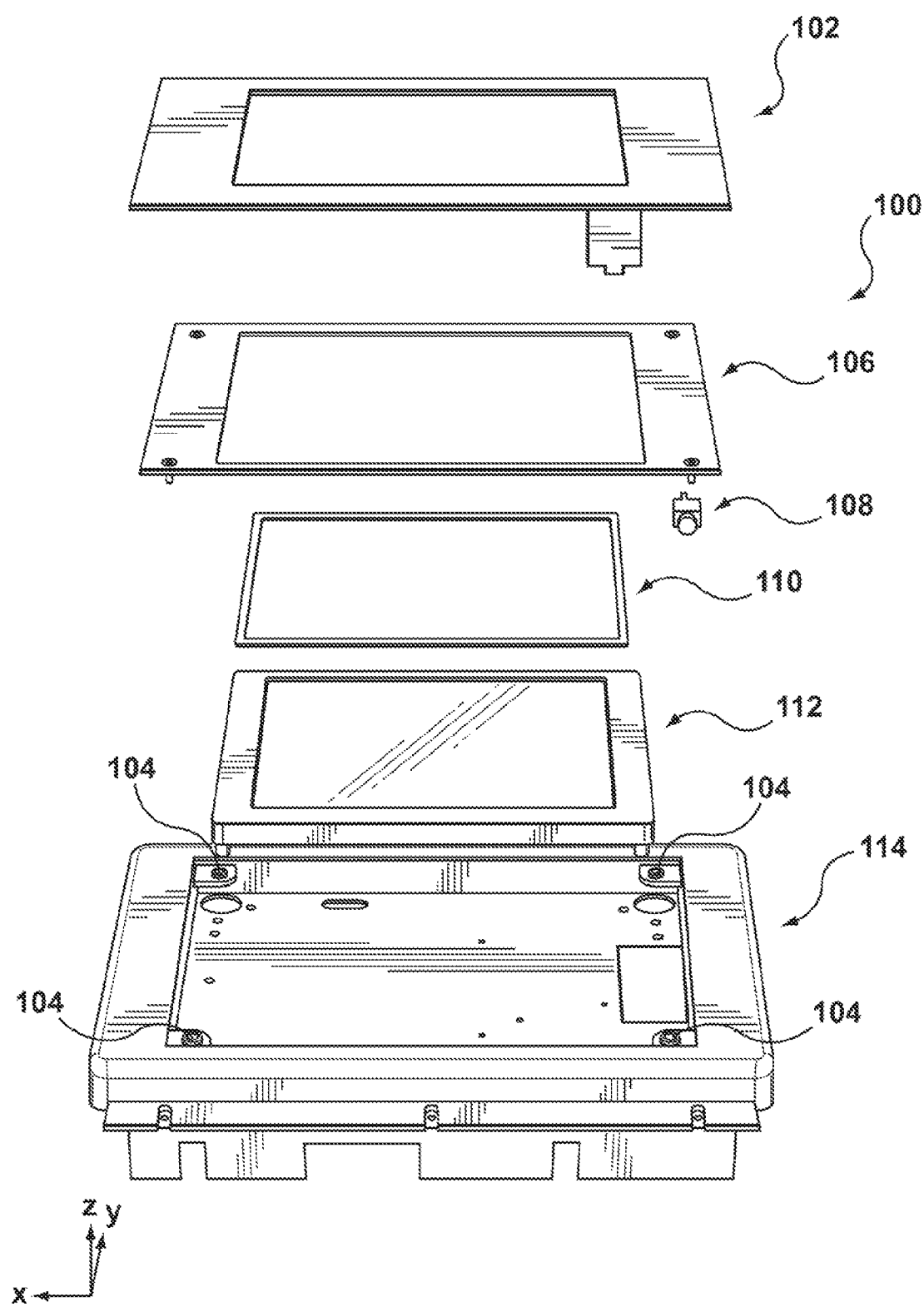
FIG. 1 is an exploded perspective view illustrating various components of a prior art touch screen system for providing haptic feedback, wherein grommets are utilized for suspension.
Figure 3:
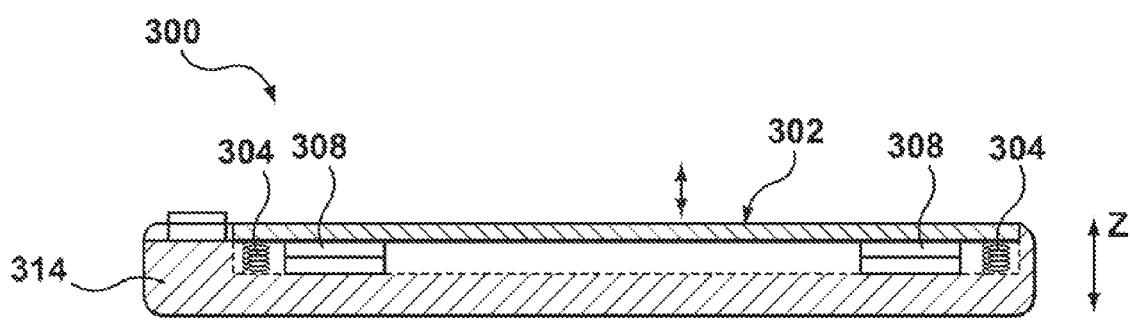
FIG. 3 is a side view of a prior art touch screen system for providing haptic feedback, wherein springs are utilized for suspension.
Figure 4:
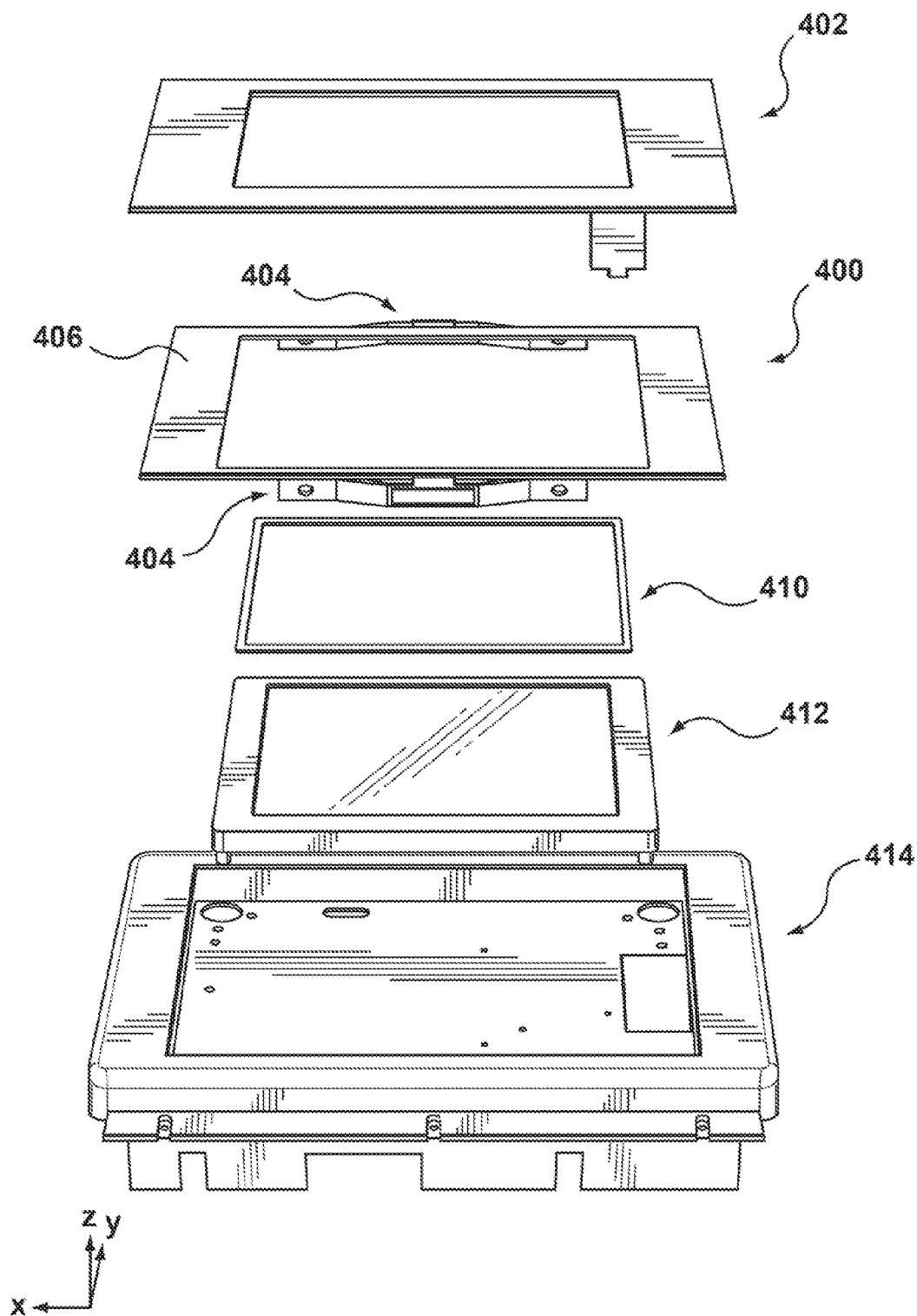
FIG. 4 is an exploded perspective view illustrating various components of a touch screen system for providing haptic feedback, wherein a plurality of spring suspension elements having integrated segments of piezo material coupled thereto are utilized for suspension and actuation in accordance with an embodiment hereof.
Figure 4A:
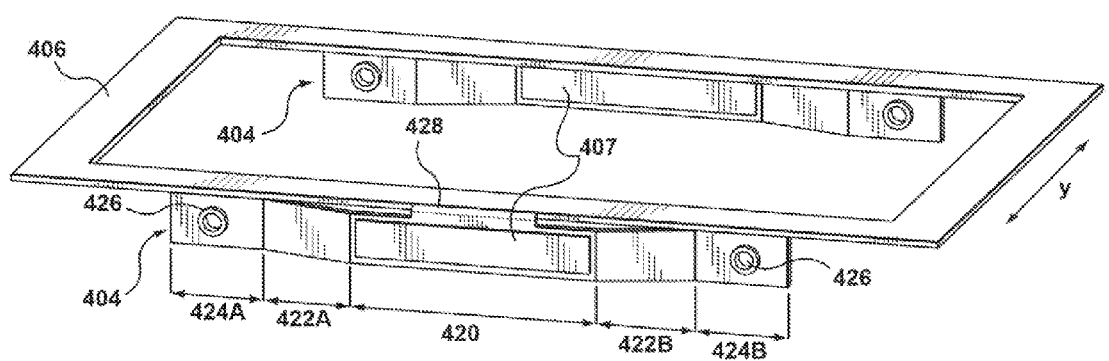
FIG. 4A is a perspective view of the spring suspension element of FIG. 4 removed from the touch screen system for illustrative purposes, wherein the spring suspension element allows for movement in the y-direction.

FIG. 4 is an exploded view illustrating various components of an electronic touch screen system 400 having a carrier 406 that includes one or more suspension elements 404 and FIG. 4A is a perspective view of carrier 406 removed from electronic touch screen system 400 for illustrative purposes. In an embodiment, electronic touch screen system 400 may be a medical device with a seven inch touch screen display, for instance. Touch screen system 400 may be any of a number of devices such as, for instance, a computer, cellular telephone, PDA, portable gaming device, media player, a printer, an office telephone, or the like. In addition to a touch screen component 402 and carrier 406, touch screen system 400 includes a dust seal 410, an LCD component 412, and a main housing component 414. Software is used to provide haptic feedback to the user of touch screen system 400. In an embodiment, touch screen component 402 can display a graphical environment based on application programs and/or operating systems that are running, such as a graphical user interface (GUI). The graphical environment may include, for example, backgrounds, windows, data listings, a cursor, icons such as buttons, and other graphical objects well known in GUI environments. A user interacts with touch screen system 400 by touching various regions of touch screen component 402 to activate, move, flip, advance, or otherwise manipulate the virtual graphical objects displayed on the screen, and thereby to provide inputs to the device. Such touch screens and GUIs are well known, as exemplified in U.S. Pat. Appl. Pub. No. 2008/0111788 A1 to Rosenberg et al. incorporated by reference above.

Carrier 406 is a flat or planar component that forms a rectangular border or frame, although other shapes or configurations are possible depending upon the shape of touch screen component 402. Carrier 406 may be formed from a sheet metal such as steel or aluminum, or a plastic material such as polycarbonate or PC-ABS. At least one compliant suspension element 404 extends from carrier 406 for coupling touch screen component 402 to the rigid housing component 414 of system 400. In the embodiment of FIG. 4A, two identical suspension elements 404 extend from opposing ends or edges of carrier 406 but it will be understood by those of ordinary skill in the art that more suspension elements may be utilized, or only one suspension element may be utilized. Suspension elements 404 are bent sheet metal or bent plastic springs that include two end portions 424A, 424B, two compliant portions 422A, 422B, and an intermediate or middle portion 420. Suspension elements 404 are thin and flat segments of material, and end portions 424A, 424B, compliant portions 422A, 422B, and intermediate portion 420 thereof are integrally formed by bending or shaping each portion relative to each other as described below. Suspension elements 404 are relatively inexpensive, easy to manufacture and assemble, and provide reliable suspension that combats the effects of compression set seen in other suspension approaches such as foam.

Suspension elements 404 are coupled to carrier 406 such that suspension elements 404 extend generally perpendicular to carrier 406. "Generally perpendicular" as used herein includes a suspension element having one or more integral portions thereof that extend perpendicular to the carrier, although one or more other integral portions of the suspension element do not extend perpendicular to the carrier. End portions 424A, 424B extend perpendicularly from the outer edge or perimeter of carrier 406 but are not attached or otherwise coupled thereto. End portions 424A, 424B each include an opening or hole 426 sized to receive a fastener (not shown) for coupling suspension element 402 to housing component 414, as explained in more detail herein. Middle portion 420 also extends perpendicular to carrier 406 but is spaced apart from the outer edge or perimeter of carrier 406 in the −y direction. Middle portion 420 is coupled to carrier 406 via a connector 428. Connector 428 and suspension elements 404 may be integrally formed with carrier 406 from a single piece of material, or suspension elements 404 and carrier 406 may be separate components that are connected via connector 428. Compliant portions 422A, 422B are bent or angled portions of suspension element 404 and extend between intermediate portion 420 and end portions 424A, 424B, respectively.

As will be explained in more detail herein, in one embodiment, segments 407 of piezo material are coupled to opposing sides or surfaces of middle portion 420 for providing haptic effects or feedback to touch screen component 402. Suspension element 404 is thus essentially utilized as a substrate for segments 407 of piezo or piezoceramic material, and thus an intermediate substrate as described with respect to FIG. 2 is not required. Piezoceramic material can be made very thin and small, thereby allowing its use in compact housings that are typical for portable electronic devices. By directly attaching segments 407 of piezo material to suspension element 404, suspension element 404 serves the dual functions of providing haptic effects to the system via segments 407 of piezo material and compliantly mounting the touch screen within the housing. In addition, by integrating suspension element 404 and piezo material, mounts and/or clamps typically required for coupling a piezo actuator to a touch screen system are eliminated and the complexity and cost of manufacture is reduced. Further, the required size and number of components in the final assembly is reduced. In another embodiment hereof (not shown), segments 407 of piezo material are coupled to only one side or surface of middle portion 420 for providing haptic effects or feedback to touch screen component 402. Further, it is not required that one or more segments of piezo material be coupled to all suspension elements of the carrier. For example, only one of the two suspension elements 404 of FIG. 4A require at least one segment 407 of peizo material for providing haptic effects or feedback to touch screen component 402.

Carrier 406 attaches to touch screen component 402 in any suitable manner, and thus any forces produced by segments 407 of piezo material are directly applied to touch screen component 402. Touch screen system 400 includes control hardware and software that provide electric signals to the segments 407 of piezo material causing segments 407 to induce desired motion of touch screen component 402 in coordination with the user's touches. A signal may be provided to, for example, induce a jolt in conjunction with a virtual button press or collisions between virtual elements, or vibrations in conjunction with movement of virtual elements across the screen, or other types of screen movements as described in more detail in U.S. Pat. Appl. Pub. No. 2008/0111788 A1 to Rosenberg et al. incorporated by reference above. Such haptic feedback or effects, also known as tactile feedback, touch feedback, and vibro-tactile feedback, allows for a more intuitive, engaging, and natural experience for the user of touch screen system 400 and thus interaction between the user and touch screen system 400 is considerably enhanced through the tactile feedback provided by the haptic effects.

Touch screen component 402 is moved by the forces output by segments 407 of piezo material. In this embodiment, the forces produced or output by segments 407 of piezo material onto touch screen component 402 are linear (or approximately linear) and along the y-axis, approximately parallel to the surface of the touch screen component 402. Compliant portions 422A, 422B of suspension elements 404 extend between end portions 424A, 424B and middle portion 420, respectively, and are configured to limit movement of touch screen component 402 to a single direction or axis determined by the force output by segments 407 of piezo material. More particularly, compliant portions 422A, 422B allow preferential movement of touch screen component 402 in a certain direction or along a certain translational axis, such as a y-direction or axis, while limiting movement in other directions or along other translational axis, such as the z-direction or axis and x-direction or axis, when installed within touch screen system 400. When suspension elements 404 are installed between touch screen component 402 and housing component 414, end portions 424A, 424B are coupled to housing component 414 and middle section 420 is coupled to touch screen component 402. With end portions 424A, 424B coupled to rigid housing component 414, side to side movement of touch screen component 402 in the x-direction is not permitted. In addition, suspension elements 404 are formed of a sufficiently stiff material that up and down movement of touch screen component 402 in the z-direction is also not permitted. However, when segments 407 of piezo material output a force in the y-direction, i.e., parallel to carrier 406 and touch screen component 402, compliant portions 422A, 422B of suspension elements 404 allow movement of touch screen component 402 in the y-direction in order to provide haptic effects to the user. When the user applies forces to touch screen component 402 in either the x- and/or z-directions, suspension elements 404 do not allow movement of touch screen component 402 in these directions and as such the user feels as though touch screen component 402 is rigidly mounted within housing component 414.

In order to assemble a touch screen system according to any embodiment described herein, segments of piezo material are coupled to at least one surface of the compliant portions of one or more suspension elements. The segments of piezo material may be coupled to opposing surfaces of the compliant portions of the suspension elements, or may be coupled to only one surface of the compliant portions of the suspension elements, via adhesive or other suitable mechanical method. The suspension elements may be integrally formed with a carrier, or may be separate components attached to the carrier via a coupler or connector. The carrier including the integral or attached suspension elements is then coupled to a touch screen. The carrier attaches to the touch screen in any suitable manner. The carrier and touch screen attached together is herein referred to as a touch screen subassembly.

The touch screen subassembly is then attached to a main housing component via a plurality of coupling means. In the embodiment shown in FIG. 4, suspension elements 404 includes four holes 426 for receiving fasteners (not shown) that are utilized to secure the touch screen subassembly to main housing component 414. The fasteners may be threaded fasteners, such as machine screws or shoulder bolts, fastened with a corresponding washer and nut to thereby attach the touch screen subassembly to the main housing component. In another embodiment, the washer and nut may be replaced by a threaded hole that is sized to receive the threaded fastener. In other embodiments, the fasteners may be internally or externally threaded posts made integral with the suspension elements to extend through the main housing component for threadably coupling with a respective screw or nut, as appropriate, to secure the touch screen subassembly to the main housing component. In other embodiments, other suitable coupling means including but not limited to snap fit fasteners, press fit fasteners, and adhesive may be used as would be apparent to one of ordinary skill in the art. An LCD component may also be also fixed to the main housing component in any suitable manner with a dust seal installed to prevent dust intrusion between the touch screen and the LCD component. Once the touch screen system is assembled, the suspension elements allow movement between the touch screen component and the housing component in a first direction and limit movement between the touch screen component and the housing component in a least a second direction.

Figure 5:
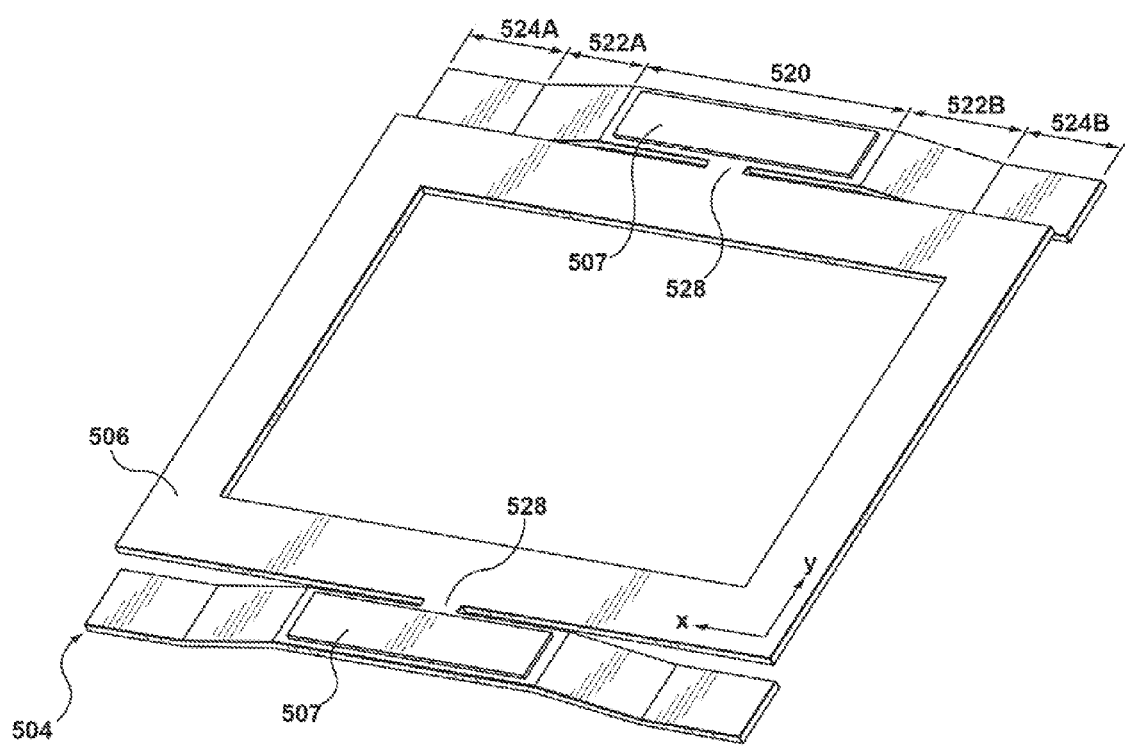
FIG. 5 is a perspective view of a spring suspension element according to another embodiment hereof, wherein the spring suspension element allows for movement in the z-direction.

Although segments 407 of piezo material are described as outputting forces in the y-direction and suspension elements 404 are described as limiting movement of touch screen component 402 to the z- and x-directions, the suspension elements may be modified to allow movement in other directions output by segments of piezo material. For example, FIG. 5 illustrates another embodiment in which suspension elements 504 allow movement in the z-direction and limit movement in the x- and y-directions. Similar to carrier 406, carrier 506 is a flat or planar component that forms a rectangular border or frame. Two compliant suspension elements 504 are bent sheet metal or bent plastic springs that each include two end portions 524A, 524B, two compliant portions 522A, 522B, and a middle portion 520 and extend generally parallel to carrier 506 for coupling a touch screen (not shown) to a rigid housing (not shown). Suspension elements 504 are thin and flat segments of material, and end portions 524A, 524B, compliant portions 522A, 522B, and intermediate portion 520 thereof are integrally formed by bending or shaping each portion relative to each other as described below.

Suspension elements 504 are coupled to carrier 506 such that suspension elements 504 extend generally parallel to carrier 506. "Generally parallel" as used herein includes a suspension element having one or more integral portions thereof that extend parallel to the carrier, although one or more other integral portions of the suspension element do not extend parallel to the carrier. Middle portion 520 extends parallel to carrier 506 and is coupled to outer edge or perimeter of carrier 506 via a connector 528. End portions 524A, 524B also extend generally parallel to carrier 506 but are spaced apart in the z-direction from carrier 506 and are not coupled to the outer edge or perimeter of carrier 506. Compliant portions 522A, 522B are bent or angled portions of suspension element 504 and extend between intermediate portion 520 and end portions 524A, 524B, respectively.

Segments 507 of piezo material are coupled to opposing sides or surfaces of middle portion 520 for providing haptic effects or feedback to touch screen component 402. In this embodiment, the forces output by segments 507 of piezo material onto touch screen component 402 are linear (or approximately linear) and along the z-axis, approximately perpendicular or normal to the surface of the touch screen. Compliant portions 522A, 522B of suspension elements 504 extend between end portions 524A, 524B and middle portion 520, respectively, and are configured allow movement in the z-direction and limit movement in the x- and y-directions. When installed within the touch screen system, end portions 524A, 524B are couple to the rigid housing and side to side movement of the touch screen in the x-direction is not permitted. In addition, suspension elements 504 are formed of a sufficiently stiff material such that movement of the touch screen in the y-direction is also not permitted. However, when segments 507 of piezo material output a force in the z-direction, i.e., perpendicular or normal to carrier 506 and the touch screen, compliant portions 522A, 522B of suspension elements 504 allow up and down movement of the touch screen in the z-direction in order to provide haptic effects to the user. When the user applies forces to the touch screen in either the x- and/or y-directions, suspension elements 504 do not allow movement of the touch screen in these directions and as such the user feels as though the touch screen is rigidly mounted within the housing.

Figure 6A:
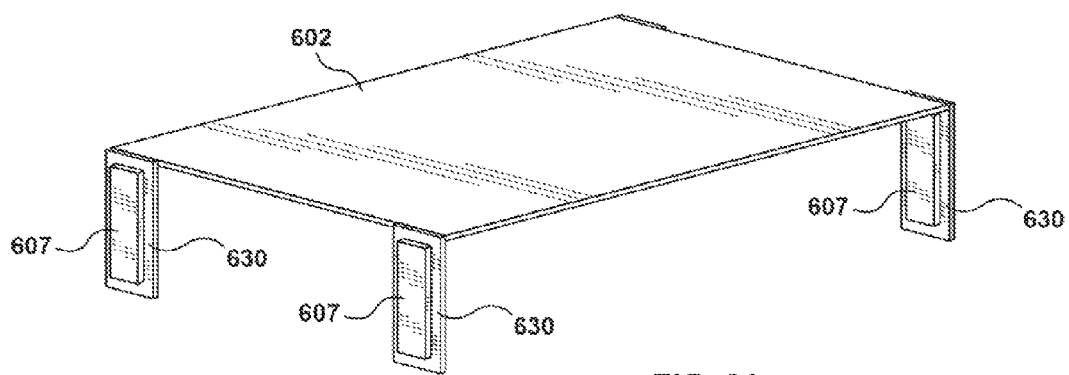
FIG. 6A illustrates a perspective view of a touch screen having segments of piezo material coupled thereto according to another embodiment hereof.
Figure 6B:
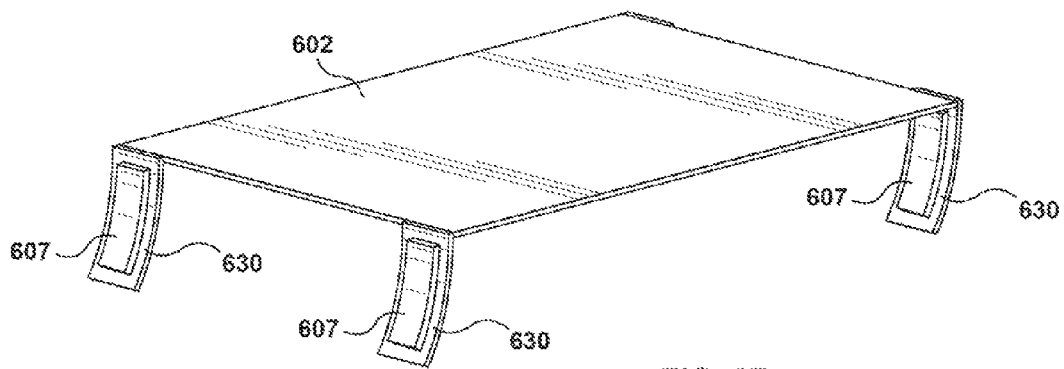
FIG. 6B is a perspective view of the touch screen of FIG. 6A after producing an electric charge and bending in response thereto.

In another embodiment hereof, segments of piezo material may be coupled to any area of a carrier or a touch screen and an alternative type of suspension such as grommets, helical springs, or foam may be utilized for compliantly coupling the touch screen to the housing. For example, referring to FIG. 6A and FIG. 6B, a touch screen component 602 includes tabs 630 that extend generally perpendicular from an outside edge or perimeter of the touch screen. Segments 607 of piezo material are coupled to opposing sides or surfaces of tabs 630 for providing haptic effects or feedback to touch screen component 602. FIG. 6B illustrates segments 607 of piezo material after the segments develop an electric charge and bend, thereby moving touch screen component 602. Tabs 630 are thus utilized as a substrate for segments 607 of piezo material, and thus an intermediate substrate as described with respect to FIG. 2 is not required. By directly attaching segments 607 of piezo material to the touch screen itself, mounts and/or clamps typically required for coupling a piezo actuator to a touch screen system are not required, thereby reducing complexity, the number of component, and the cost of manufacture. In another embodiment hereof (not shown), segments 607 of piezo material are coupled to only one side or surface of tabs 630 for providing haptic effects or feedback to touch screen component 602. Further, it is not required that one or more segments of piezo material be coupled to all tabs 630. For example, only one of the four tabs 630 require at least one segment 607 of peizo material for providing haptic effects or feedback to touch screen component 602.

Figure 7:
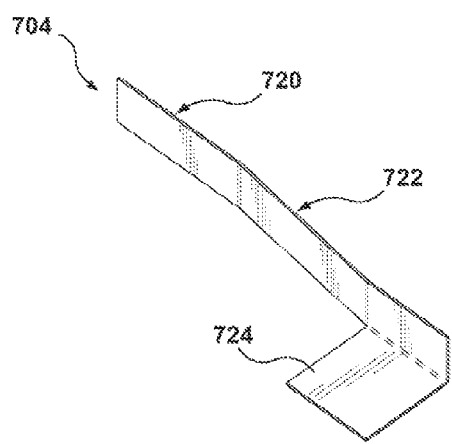
FIG. 7 is a perspective view of a compliant suspension element for coupling a touch screen to a housing of a haptic system according to another embodiment hereof.
Figure 8:
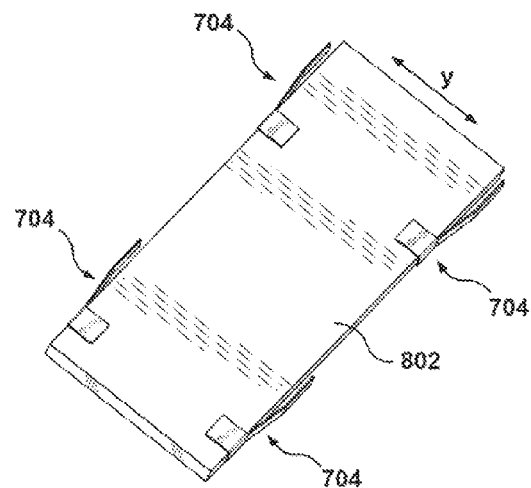
FIG. 8 is a perspective view of the suspension element of FIG. 7 coupled to a touch screen.

FIG. 7 and FIG. 8 illustrate an alternative embodiment of a compliant suspension element 704 for coupling a touch screen to a housing of a haptic system. FIG. 7 illustrates a perspective view of suspension element 704, while FIG. 8 illustrates a plurality of suspension elements 704 coupled to a touch screen component 802. In the embodiment of FIG. 8, four identical suspension elements 704 are coupled to touch screen component 802 but it will be understood by those of ordinary skill in the art that more suspension elements may be utilized, or only one suspension element may be utilized. Suspension elements 704 are bent sheet metal or bent plastic springs that a first L-shaped bracket 724, a second end tab 720, and an intermediate compliant portion 722 extending there between. Compliant portion 722 is a bent or angled portion of suspension element 704. When a plurality of suspension elements 704 are installed in a touch screen system, each L-shaped bracket 724 couples to touch screen component 802 as shown in FIG. 8 and each second end portion 720 couples to a rigid housing (not shown). Compliant portions 722 of suspension elements 704 are not coupled to either touch screen component 802 or the housing, and are configured to limit movement of touch screen component 802 to a single direction or axis determined by the force output by an actuator. The actuator may be segments of piezo material (not shown) coupled to opposing sides or surfaces of compliant portion 722 of suspension element 704 as described herein, or may alternatively be any of a number of known actuator types including, without limitation, a piezo actuator, voice coil actuator, an eccentric mass actuator, an E-core type actuator, a solenoid, a moving magnet actuator, or other type of actuator as desired.

More particularly, compliant portion 722 allows preferential movement of touch screen component 802 in a certain direction or along a certain translational axis, such as a y-direction or axis, while limiting movement in other directions or along other translational axis, such as the z-direction or axis and x-direction or axis, when installed within a touch screen system. Side to side movement of touch screen component 802 in the x-direction is not permitted because suspension elements 704 are formed of a sufficiently stiff or rigid material having a high spring constant in the −x direction and compliant portion 722 forms a very acute angle, i.e., less than 45 degrees, with respect to the adjacent edge of touch screen component 802. In addition, second end portion 720 coupled to a rigid housing (not shown) and if force is directly exerted in the −x direction, suspension elements 704 will resist movement in the −x direction and the force will be transferred into the housing. Further, up and down movement of touch screen component 802 in the z-direction is also not permitted because suspension elements 704 are formed of a sufficiently stiff or rigid material having a high spring constant in the −z direction. However, suspension elements 704 have a low spring constant in the −y direction and when the actuator outputs a force in the y-direction, i.e., parallel to touch screen component 802, compliant portions 722 of each suspension element 704 allow movement of touch screen component 802 in the y-direction in order to provide haptic effects to the user. When the user applies forces to touch screen component 802 in either the x- and/or z-directions, compliant portions 722 of each suspension element 704 do not allow movement of touch screen component 802 in these directions and as such the user feels as though touch screen component 802 is rigidly mounted within the housing.

In another embodiment hereof (not shown), suspension elements 704 may be coupled or integrally formed with a carrier used in the touch screen system or may be coupled or integrally formed with the housing. In accordance with embodiments hereof, suspension elements may be formed to have different properties in different directions. By changing the geometry, materials and mounting conditions, the performance of the spring suspension element can be designed to match the system in which it is installed. For example, the stiffness may be varied in different directions, i.e., higher in one direction and lower in another direction, to allow a touch screen to move in the direction of the desired haptic effect but be very rigid in other directions. Changing the geometry of the spring suspension element may change the stiffness in a particular axis via the addition of a stiffening rib or bend in the appropriate direction. Changing the mounting conditions of the spring suspension element via a flexible, i.e., rubber or foam, mount also provides variable stiffness as well.

Figure 9:
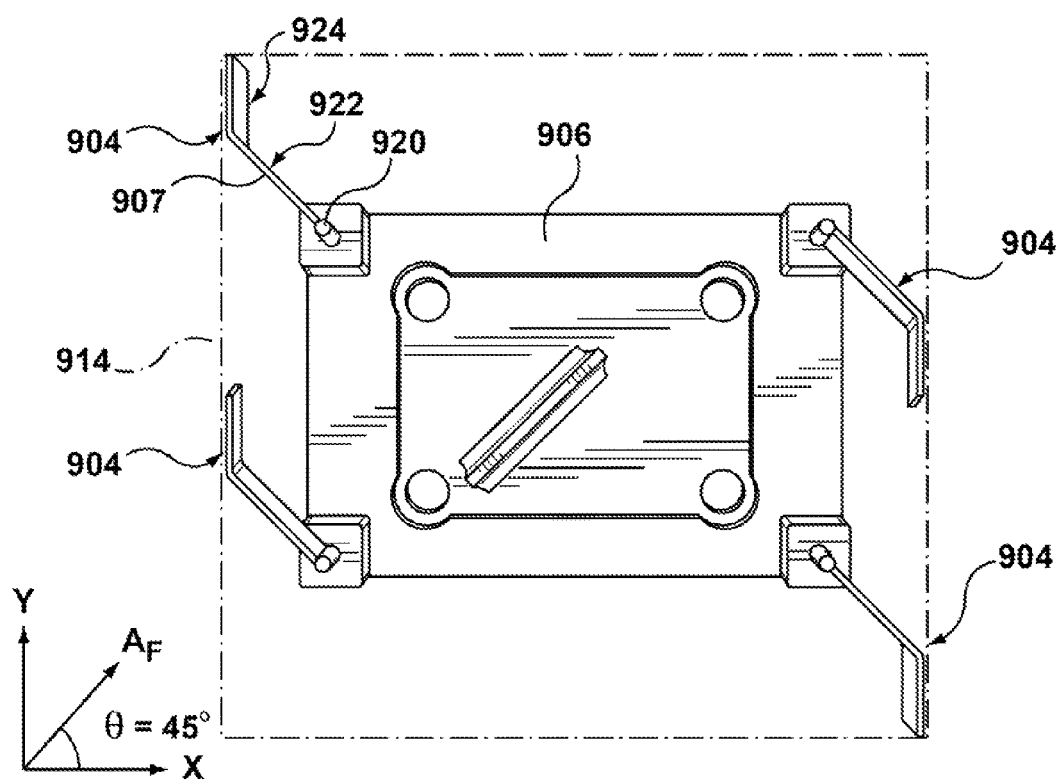
FIG. 9 is a perspective view of a plurality of spring suspension elements coupled to a carrier according to another embodiment hereof, wherein the spring suspension element includes segments of piezo material coupled thereto that are mounted at an angle relative to the carrier.

FIG. 9 illustrates an alternative embodiment of a compliant suspension element 904 for coupling a touch screen to a housing of a haptic system. FIG. 9 illustrates a plurality of suspension elements 904 coupled to a carrier 906. In another embodiment hereof (not shown), suspension elements 904 may be coupled or integrally formed with a touch screen component used in the touch screen system or may be coupled or integrally formed with the housing. In the embodiment of FIG. 9, four identical suspension elements 904 are coupled to carrier 906 but it will be understood by those of ordinary skill in the art that more suspension elements may be utilized, or only one suspension element may be utilized. Suspension elements 904 are bent sheet metal or bent plastic springs that include a first end tab 924 and an angled or bent compliant portion 922. When a plurality of suspension elements 904 are installed in a touch screen system, each first end tab 924 is configured to couple to a rigid housing (not shown) and a first end 920 of compliant portion 922 is coupled to carrier 906 and extends at approximately a forty-five degree angle with respect to carrier 906 as shown in FIG. 9. Suspension elements 904 are coupled to carrier 906 such that each first end tab 924 extends generally perpendicular to carrier 906. Each first end tab 924 extends perpendicularly from the outer edge or perimeter of carrier 906 but is spaced apart from carrier 906 via compliant portions 922.

When installed within a touch screen system, compliant portion 922 allows preferential movement of carrier 906 in a y-direction or axis and a x-direction or axis while limiting movement in the z-direction or axis. Suspension elements 904 are formed of a sufficiently stiff material that up and down movement of carrier 906 in the z-direction is not permitted. To form an actuator, segments of piezo material 907 are coupled to opposing sides or surfaces of the angled or bent compliant portion 922 of suspension element 904. Since compliant portions 922 of suspension elements 904, and thereby segments of piezo material 907, are mounted at approximately a 45 degree angle with respect to carrier 906 and a housing 914 (shown in phantom in FIG. 9) of the touch screen system, the force output by the actuator, i.e., the segments of piezo material 907, is offset or angled with respect to the touch screen system as indicated by directional arrow $A_F$. "Approximately" a 45 degree angle as used herein includes angles ranging between 40 and 50 degrees. Mounting the actuator at a 45 degree angle with respect to carrier 906 and housing 914 balances the force vectors evenly between the x- and y-directions such that when the actuator outputs a force in the direction of arrow $A_F$, the x- and the y-components of the force output by actuator 907 are approximately equal. Compliant portions 922 of each suspension element 904 allow movement of carrier 906 in the y-direction and in the x-direction in order to provide haptic effects to the user. The offset or angled mount of segments of piezo material 907 with respect to the touch screen system produces a more consistent haptic user experience because the force output by the actuator is approximately equal in the x-direction and the y-direction as the user navigates the GUI of the touch screen system in those directions, as typically occurs when a user scrolls up-down and/or left-right on a touchpad GUI. However, when the user applies forces to carrier 906 in the z-direction, compliant portions 922 of each suspension element 904 do not allow movement of carrier 906 in these directions and as such the user feels as though carrier 906 is rigidly mounted within the housing.

In another embodiment hereof, the mounted angle of actuator, i.e., segments of piezo material 907 coupled to compliant portions 922 of suspension elements 904, with respect to carrier 906 and housing 914 may be varied or modified to control the level of force directed at one axis versus the other based on the angle chosen. More particularly, if it is desired for the user to experience more movement or travel in one of the −x or −y directions, the actuator may be mounted with respect to the carrier and the housing at an angle other than approximately 45 degrees to result in uneven or nonequal x- and y-components of the force output by the actuator.

Figure 10:
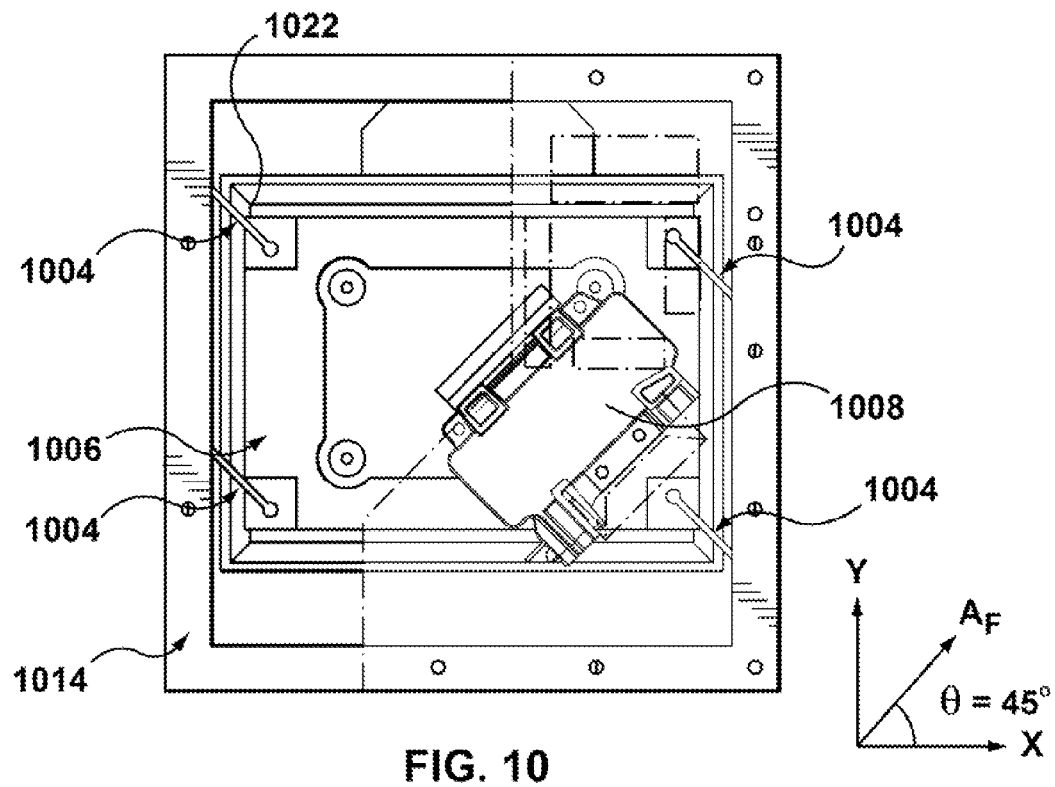
FIG. 10 is a perspective view of the plurality of spring suspension elements of FIG. 9 being utilized with a different type of actuator that is mounted at an angle relative to the carrier according to another embodiment hereof.

In another embodiment, suspension elements 904 may be utilized in a touch screen system with another type of actuator rather than segments of piezo material attached thereto. More particularly, FIG. 10 illustrates a carrier 1006 having suspension elements 1004 coupled thereto for coupling the carrier to a rigid housing 1014. Suspension elements 1004 are the same structure as described with respect to suspension elements 904, except that no segments of piezo material are coupled thereto. An actuator 1008 is shown coupled to an underside surface of carrier 1006 and serves to output a small pulse, vibration, or texture sensation onto a touch screen component (not shown) and to the user if the user is contacting the touch screen. Actuator 1008 may be any of a number of known actuator types including, without limitation, a piezo actuator, a solenoid, voice coil actuator, an eccentric mass actuator, an E-core type actuator, a moving magnet actuator, or other type of actuator as desired. Actuator 1008 is mounted at approximately a 45 degree angle with respect to carrier 1006 and housing 1014, the force output by actuator 1008 is offset or angled with respect to the touch screen system as indicated by directional arrow $A_F$. When the actuator outputs a force in the direction of arrow $A_F$, the x- and the y-components of the force output by actuator 1008 are approximately equal. Compliant portions 1022 of each suspension element 1004 allow movement of carrier 1006 in the y-direction and in the x-direction in order to provide haptic effects to the user. The offset or angled mount of actuator 1008 with respect to the touch screen system produces a more consistent haptic user experience because the force output by the actuator is approximately equal in the x-direction and the y-direction as the user navigates the GUI of the touch screen system in those directions, as typically occurs when a user scrolls up-down and/or left-right on a touchpad GUI. However, when the user applies forces to carrier 1006 in the z-direction, compliant portions 1022 of each suspension element 1004 do not allow movement of carrier 1006 in these directions and as such the user feels as though carrier 1006 is rigidly mounted within the housing.

Figure 11:
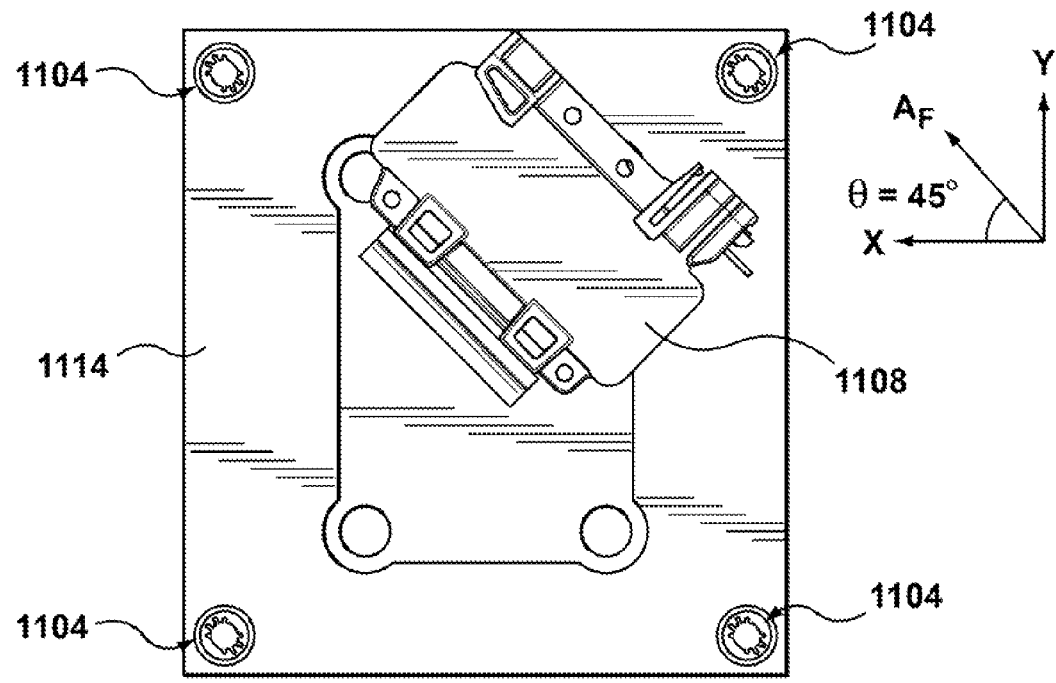
FIG. 11 is an actuator mounted at an angle relative to a carrier, wherein an alternative suspension system is utilized according to another embodiment hereof.

Although illustrated with suspension elements 1004, an actuator mounted offset or angled with respect to the touch screen system may be utilized with other types of suspension elements. For example, as shown in FIG. 11, a touch screen system includes a rigid housing 1114 having grommet suspension elements 1104 for coupling a touch screen (not shown) and/or a carrier (not shown) thereto. Grommet suspension elements 1104 are configured to allow preferential movement of a touch screen 102 in one or more certain directions, such as an x- and y-directions. Grommet suspension elements 1104 are configured to allow movement in the direction of directional arrow $A_F$, i.e., against the textured inner surface or sides of grommet suspension elements 1104. Grommet suspension elements 1104 are configured to limit movement in another direction, such as the z-direction and in the direction perpendicular to directional arrow $A_F$, i.e., against the smooth or solid inner surface or sides of grommet suspension elements 1104. As described herein, suspensions utilizing compliant grommet for mounting touch screens and touch surfaces within a housing are known, as illustrated in U.S. patent application Ser. No. 13/049,265 to Olien et al., filed Mar. 16, 2011, previously incorporated by reference in its entirety. Other grommet suspension configurations may be utilized herewith. An actuator 1108 is shown angled or offset with respect to housing 1114 and serves to output a small pulse, vibration, or texture sensation onto a touch screen (not shown) and to the user if the user is contacting the touch screen. Actuator 1108 may be any of a number of known actuator types including, without limitation, a piezo actuator, a solenoid, voice coil actuator, an eccentric mass actuator, an E-core type actuator, a moving magnet actuator, or other type of actuator as desired. Similar to the embodiment of FIG. 10, actuator 1108 is mounted at approximately a 45 degree angle with respect to the touch screen system and the force output by actuator 1108 is offset or angled with respect to the touch screen system as indicated by directional arrow $A_F$. When the actuator outputs a force in the direction of arrow $A_F$, the x- and the y-components of the force output by actuator 1108 are approximately equal. Although shown utilized with grommet suspension elements, an actuator mounted offset or angled with respect to the touch screen system may be utilized with other suspension systems including but not limited to helical or coiled elements, rubber, foam, or flexures.

While various embodiments have been described above, it should be understood that they have been presented only as illustrations and examples of the present invention, and not by way of limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the appended claims and their equivalents. It will also be understood that each feature of each embodiment discussed herein, and of each reference cited herein, can be used in combination with the features of any other embodiment. All patents and publications discussed herein are incorporated by reference herein in their entirety.

What is claimed is:

1. A method of manufacturing a haptic device having a compliant suspension system, the method comprising the steps of:
   coupling a segment of piezo material to at least one surface of a compliant suspension element, wherein the compliant suspension element is a flat bent spring that includes a first end portion, a second end portion, a first compliant portion, a second compliant portion, and an intermediate portion, the first and second compliant portions being bent with respect to and extending between the intermediate portion and the first and second end portions, respectively, and the step of coupling the segment of piezo material to the at least one surface of the compliant suspension element includes coupling the segment of piezo material to the intermediate portion of the flat bent spring;
   coupling the intermediate portion of the flat bent spring to a touch screen component; and
   coupling the first and second end portions of the flat bent spring to a housing component, wherein the segment of piezo material is configured to produce a force that moves the touch screen component relative to the housing component and thereby provide a haptic effect to a user of the touch screen component and wherein in reaction to the force produced by the segment of piezo material the first and second compliant portions of the flat bent spring are configured to allow movement of the touch screen component relative to the housing component in a first direction while also being configured to limit movement between the touch screen component and the housing component in at least a second direction, the second direction being different than the first direction.

2. The method of claim 1, wherein the segment of piezo material is coupled to the at least one surface of the suspension element via adhesive.

3. The method of claim 1, wherein the suspension element is coupled to or integrally formed with a carrier and the step of coupling the intermediate portion of the flat bent spring to the touch screen component includes coupling the carrier to the touch screen component.

4. The method of claim 1, wherein the first and second end portions of the flat bent spring each includes at least one hole sized to receive a fastener and the step of coupling the first and second end portions of the flat bent spring to the housing component includes threading the fastener through the at least one hole to secure the suspension element to the housing component.

5. The method of claim 1, further comprising the step of coupling a LCD component to the housing component.

6. The method of claim 5, further comprising the step of installing a dust seal between the touch screen component and the LCD component.

7. The method of claim 1, wherein the step of coupling the segment of piezo material to the intermediate portion of the flat bent spring includes coupling two segments of piezo material to opposing surfaces of the intermediate portion of the flat bent spring.

8. The method of claim 1, wherein the intermediate portion of the flat bend spring extends perpendicular to the touch screen component and the first and second compliant portions of the flat bent spring are configured to allow movement of the touch screen component relative to the housing component in the first direction while also being configured to limit movement between the touch screen component and the housing component in the second direction and a third direction, wherein the first direction is a y-direction, the second direction is an x-direction and the third direction is a z-direction.

9. The method of claim 1, wherein the intermediate portion of the flat bend spring extends parallel to the touch screen component and the first and second compliant portions of the flat bent spring are configured to allow movement of the touch screen component relative to the housing component in the first direction while also being configured to limit movement between the touch screen component and the housing component in the second direction and the third direction, wherein the first direction is a z-direction, the second direction is an x-direction and the third direction is a y-direction.

10. A method of manufacturing a haptic device having a compliant suspension system, the method comprising the steps of:
    coupling a segment of piezo material to at least one surface of a compliant suspension element, wherein the compliant suspension element is a flat bent spring having a compliant portion that is bent with respect to an end portion and the step of coupling the segment of piezo material to at least one surface of the compliant suspension element includes coupling the segment of piezo material to the compliant portion of the flat bent spring;
    coupling the compliant portion of the flat bent spring to a touch screen component; and
    coupling the end portion of the flat bent spring to a housing component, wherein the segment of piezo material is configured to produce a force that moves the touch screen component relative to the housing component and thereby provide a haptic effect to a user of the touch screen component and wherein in reaction to the force produced by the segment of piezo material the compliant portion of the flat bent spring is configured to allow movement of the touch screen component relative to the housing component in a x-direction and in a y-direction while also being configured to limit movement between the touch screen component and the housing component in a z-direction direction, wherein the compliant portion of the flat bent spring extends at approximately a 45 degree angle with respect to the touch screen component and the housing component such that the force produced by the segment of piezo material is approximately equal in the x-direction and the y-direction.

11. The method of claim 10, wherein the segment of piezo material is coupled to the at least one surface of the suspension element via adhesive.

12. The method of claim 10, wherein the suspension element is coupled to or integrally formed with a carrier and the step of coupling the compliant portion of the flat bent spring to the touch screen component includes coupling the carrier to the touch screen component.

13. The method of claim 10, wherein the step of coupling a segment of piezo material to the compliant portion of the flat bent spring includes coupling two segments of piezo material to opposing surfaces of the compliant portion of the flat bent spring.

14. The method of claim 10, wherein an L-shaped bracket is utilized to couple the compliant portion of the flat bent spring to the touch screen component.

15. A method of manufacturing a haptic device having a compliant suspension system, the method comprising the steps of:
coupling a segment of piezo material to at least one surface of a compliant suspension element, wherein the compliant suspension element is a flat bent spring that includes a first end portion, a second end portion, a first compliant portion, a second compliant portion, and an intermediate portion, the first and second compliant portions being bent with respect to and extending between the intermediate portion and the first and second end portions, respectively, and the step of coupling the segment of piezo material to the at least one surface of the compliant suspension element includes coupling the segment of piezo material to the intermediate portion of the flat bent spring;
coupling the intermediate portion of the flat bent spring to a touch screen component; and
coupling the first and second end portions of the flat bent spring to a housing component, wherein the segment of piezo material is configured to produce a force that moves the touch screen component relative to the housing component and thereby provide a haptic effect to a user of the touch screen component and wherein in reaction to the force produced by the segment of piezo material the first and second compliant portions of the flat bent spring are configured to allow movement of the touch screen component relative to the housing component in at least one of a y-direction and a z-direction while also being configured to limit movement between the touch screen component and the housing component in at least an x-direction.

16. The method of claim 15, wherein the intermediate portion of the flat bend spring extends perpendicular to the touch screen component and the flat bent spring is configured to allow movement of the touch screen component relative to the housing component in the y-direction while also being configured to limit movement between the touch screen component and the housing component in the x-direction and the z-direction.

17. The method of claim 15, wherein the intermediate portion of the flat bend spring extends parallel to the touch screen component and the flat bent spring is configured to allow movement of the touch screen component relative to the housing component in the z-direction while also being configured to limit movement between the touch screen component and the housing component in the x-direction and the y-direction.

18. The method of claim 15, wherein the segment of piezo material is coupled to the at least one surface of the suspension element via adhesive.

19. The method of claim 15, wherein the suspension element is coupled to or integrally formed with a carrier and the step of coupling the intermediate portion of the flat bent spring to the touch screen component includes coupling the carrier to the touch screen component.

20. The method of claim 15, wherein the step of coupling the segment of piezo material to the intermediate portion of the flat bent spring includes coupling two segments of piezo material to opposing surfaces of the intermediate portion of the flat bent spring.

* * * * *

UNITED STATES PATENT AND TRADEMARK OFFICE
CERTIFICATE OF CORRECTION

PATENT NO. : 9,466,783 B2  Page 1 of 1
APPLICATION NO. : 13/558475
DATED : October 11, 2016
INVENTOR(S) : Olien et al.

It is certified that error appears in the above-identified patent and that said Letters Patent is hereby corrected as shown below:

In the Claims

Column 14, Line 5, (Claim 8): "flat bend spring" should be replaced with --flat bent spring--.

Column 14, Line 17, (Claim 9): "flat bend spring" should be replaced with --flat bent spring--.

Column 16, Line 7, (Claim 16): "flat bend spring" should be replaced with --flat bent spring--.

Column 16, Line 15, (Claim 17): "flat bend spring" should be replaced with --flat bent spring--.

Signed and Sealed this
Thirteenth Day of June, 2017

Joseph Matal
*Performing the Functions and Duties of the
Under Secretary of Commerce for Intellectual Property and
Director of the United States Patent and Trademark Office*